United States Patent [19]

Frankeny et al.

[11] Patent Number: 4,943,242

[45] Date of Patent: Jul. 24, 1990

[54] ZERO INSERTION FORCE HIGH DENSITY CONNECTOR SYSTEM

[75] Inventors: Richard F. Frankeny, Elgin; Javad Haj-ali-Ahmadi, Austin; Ronald L. Imken, Round Rock; Rolf Wustrau, Austin, all of Tex.

[73] Assignee: International Business Machines Corporation, Armonk, N.Y.

[21] Appl. No.: 347,694

[22] Filed: May 5, 1989

[51] Int. Cl.$^5$ ............................................. H01R 23/70
[52] U.S. Cl. ..................................... 439/65; 439/267; 439/634
[58] Field of Search .................... 439/65, 66, 266, 267, 439/59, 62, 630, 635, 634; 324/158 F, 158 P

[56] References Cited

U.S. PATENT DOCUMENTS

| 4,540,229 | 10/1985 | Madden | 324/158 F |
| 4,622,514 | 11/1986 | Lewis | 324/158 P |
| 4,793,814 | 12/1988 | Zifcak et al. | 439/66 |

FOREIGN PATENT DOCUMENTS

| 2234961 | 4/1973 | Fed. Rep. of Germany. | |
| 3123627 | 12/1982 | Fed. Rep. of Germany | 439/660 |

OTHER PUBLICATIONS

"Engineering Mechanics of Deformation Bodies", 2d Ed., Chapter 11, pp. 273–315, Snyder Byars.
IBM Technical Disclosure Bulletin, vol. 17, No. 2, Jul. 1974, pp. 440–441, "High-Density Double-Contact Zero Insertion Force Connector".
IBM Technical Disclosure Bulletin, vol. 17, No. 2, Jul. 1974, pp. 442–443, "Zero Insertion Connector with Individually Replaceable Contacts".
IBM Technical Disclosure Bulletin, vol. 17, No. 2, Jul. 1974, pp. 444–445, "Pin Pad Contactor".

Primary Examiner—Neil Abrams
Attorney, Agent, or Firm—Robert M. Carwell

[57] ABSTRACT

A system for providing low insertion force electrical interconnections between high density contacts for use in interconnecting circuit packages. A housing has disposed therein one or more pre-buckled beam connectors. Each connector has a resilient insulative strip carrying a plurality of buckling beams electrically isolated from each other. The beams are aligned on the plane defining the strip in parallel with ends extending away from the strip edges in opposing directions. Means are provided for deforming the strip within the housing prior to effecting desired interconnections whereby the beams are pre-buckled. Upon urging contacts into proximity with the beam ends, the buckling force is released causing each beam's ends to be urged away from the strip into engagement with respective contacts, thereby effecting desired interconnection between contacts and through one or more beams.

24 Claims, 3 Drawing Sheets

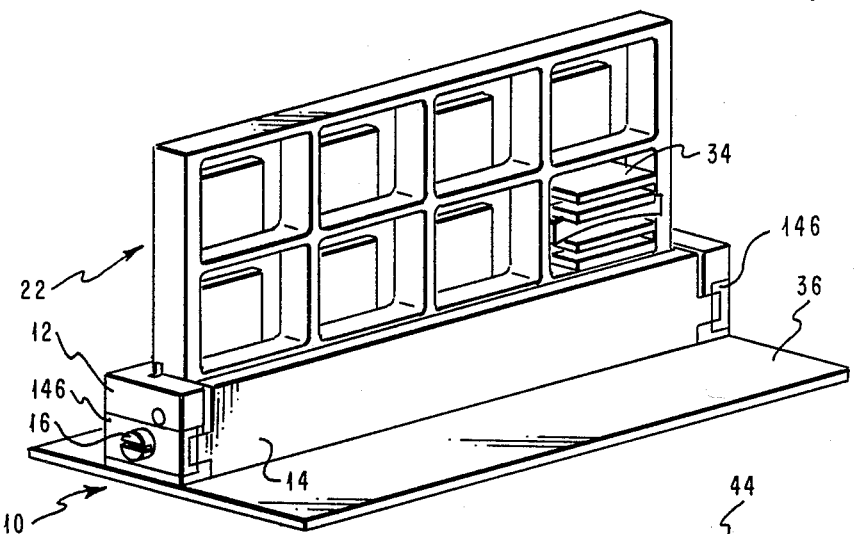
FIG. 1
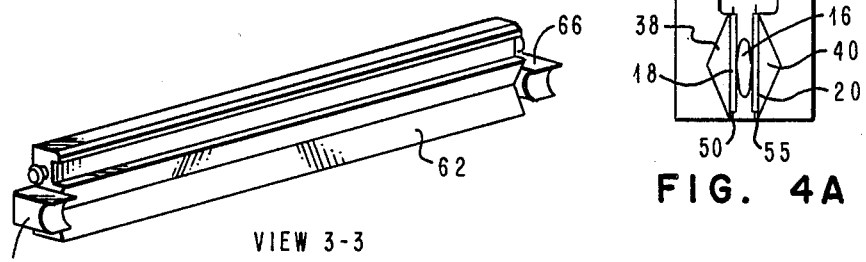
FIG. 3
FIG. 4A
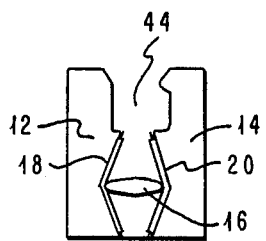
FIG. 4B
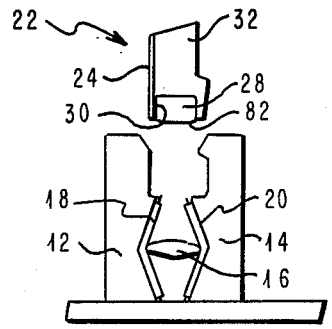
FIG. 4C
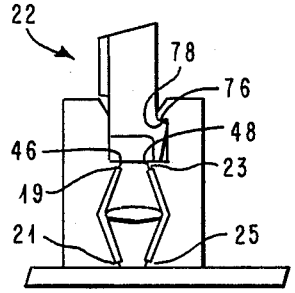
FIG. 4D

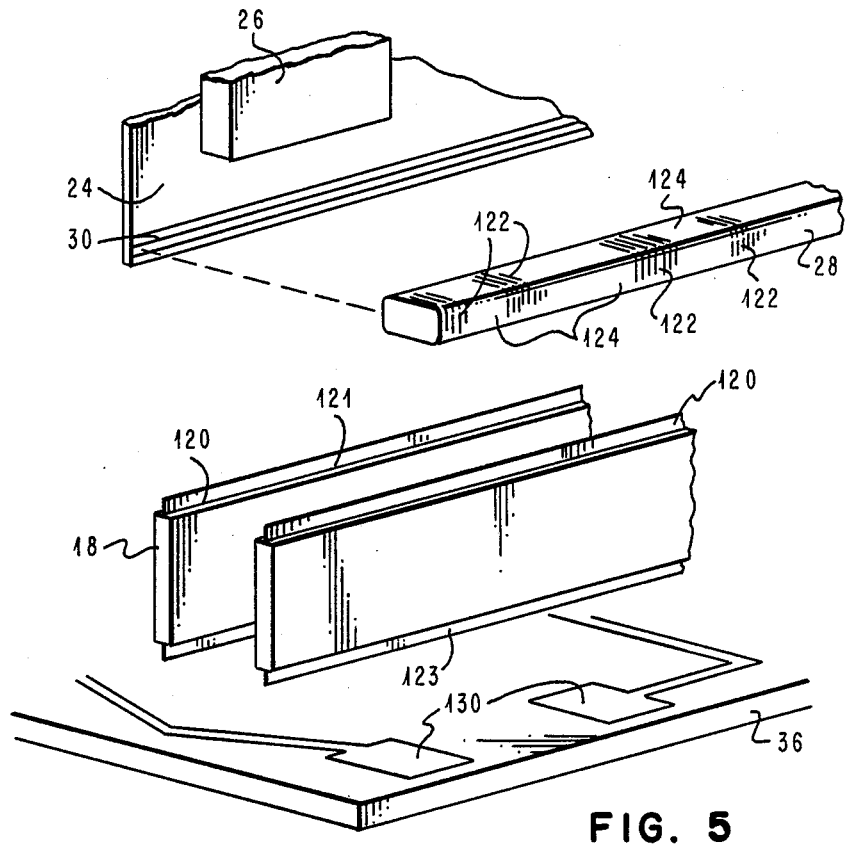
FIG. 5
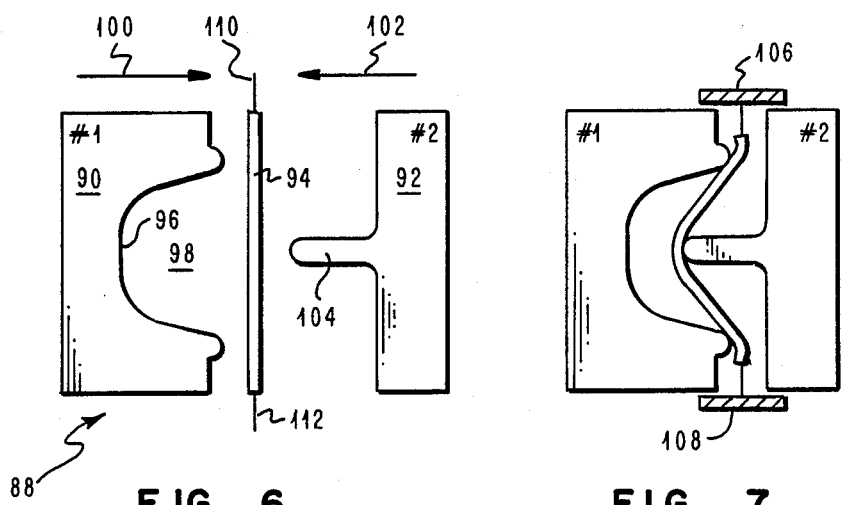
FIG. 6
FIG. 7

4,943,242

ZERO INSERTION FORCE HIGH DENSITY CONNECTOR SYSTEM

TECHNICAL FIELD

This invention relates to electrical connector systems and, more particularly, relates to zero insertion force type systems adapted for use in high density electronic packaging.

BACKGROUND ART

In the field of electronic circuit packaging with the progression towards increasingly dense packages, delicate components, and increasingly finer pitch lines, the need arose to provide for reliable interconnection between a multiplicity of contact points (as for example, between circuit cards and mother boards) wherein the forces required to be exerted in order to effect such interconnections was minimized or ideally eliminated. Accordingly, connector systems were sought in the industry which avoided the destructive forces exerted by conventional systems on these delicate and dense circuit packages occurring during the act of effecting interconnections as, for example, by the insertion of a printed circuit card into a conventional edge connector.

Accordingly, from such needs arose the development of a type of connector known in the art as a zero insertion force connector. Typically, in the operation of such connectors, pins carried on a package which was desired to be interconnected to a host board, card, or the like carried a plurality of pins which were matingly received by a like pattern of holes disposed in the host receptacle. A variety of mechanical mechanisms were provided whereby once these pins were inserted into the holes, lateral forces were imparted on the pins by metallic contacts carried by the host thereby effecting the desired electrical interconnections. The holes were sized relative to the pins whereby the initial insertion force was minimal, with the primary forces necessary to effect the interconnections being side forces. The benefits of such zero insertion force connectors thus became well known whereby the risk of damage to the circuitry was certainly reduced during the interconnection operation. A representative example of such a zero insertion force connector system is described in *IBM Technical Disclosure Bulletin*, Vol. 17, No. 2, July 1974, pages 440–441.

Notwithstanding the development of such connector systems numerous problems still remain which were compounded by the increasingly denser modern packaging techniques. These techniques resulted in the aforementioned increasingly more delicate circuit lines and circuit packages which could not withstand the forces circuit packages were subjected to upon insertion into conventional connector systems. One problem, as is clearly evident in the hereinbefore noted connector system was the sheer mechanical complexity of these systems giving rise to reliability problems, unacceptable manufacturing costs and the like. This mechanical complexity was due in part to the need to provide for these lateral connecting forces after the initial contact between the circuit package and the host. As a result of this mechanical complexity, the density of contact points on a circuit package which might be reliably interconnected was severely restricted.

Another approach known in the art for minimizing the forces necessary to be exerted on a contact point to effect electrical interconnections employed the properties of buckling beams, the general concepts of which may be found discussed in "Engineering Mechanics of Deformation Bodies", second edition 1969, Chapter 11 by Snyder Byars. The fundamental concept was to capitalize on the property of a buckling beam that a readily constant pre-determined and controllable force was necessary to compress the buckling beam member in its longitudinal direction. Two contact points which were desired to be electrically interconnected would be urged into contact with respective ends of the beam and by further thereafter urging them towards one another, which required a relatively constant nominal force which might be pre-selected and controlled by exercising good design, the desired interconnection might be effected. This technique was employed typically, for example, in probes, used in various types of test equipment.

However several serious obstacles remained in transferring the benefits of the properties of buckling beams into the electrical connector art. First, applications of such buckling beams wherein the electrical interconnections were effected by longitudinal movement of the contact points into engagement with the buckling beam ends was typically limited to applications wherein permanent electrical interconnections were not desired but rather only ones of a temporary nature as, for example, in the case of test probes and related equipment. Although the forces required for effecting interconnections by use of the buckling beam principle were admittedly reduced from those of more conventional approaches such as those encountered in typical press fit edge connectors, means were typically not provided for maintaining these forces permanently in the context of connector systems. This is quite understandable in the application to test equipment wherein the desired interconnections are intended to be quite momentary. Furthermore, application of this technique was also typically encountered with single probes wherein again the need is for effecting only a momentary contact. Whereas it is true that for example in the connector disclosed in the aforementioned Technical Disclosure Bulletin provision is made for a plurality of such buckling beams, it is further typical that the actual mechanical interconnection to the plurality of pins was effected by means of side forces.

Furthermore, yet an additional drawback to attempted applications of buckling beams in connector systems remained. Although it is true the necessary insertion force for contact might be significantly reduced over that required by conventional systems, such force was nevertheless still required (as contrasted, for example, with the true zero insertion force connectors known in the art with their attendant mechanical complexities). With the increased density of contact points in modern electronic packaging technology, such reduced forces when multiplied by the number of necessary connections to be made still heretofore rendered the cumulative longitudinal compressional buckling forces unacceptable for the connector makeup.

For the foregoing and other reasons, an electrical connector system was long needed in the art which provided the benefits of both zero insertion force connectors as well as interconnections effected by means of buckling beams wherein the contacts might be made by contact points on the ends of circuit packages when brought into engagement with the buckling beams rather than through the conventional use of lateral forces. Such a connector system was further highly sought after which could not only provide for end point contacts, but was mechanically simply, reliable, inexpensive to manufacture, and readily adaptable to the vastly increasing contact point densities and connector requirements wherein even minute insertion forces were intolerable. These and other deficiencies of the connector systems of the prior art are overcome by the subject invention.

SUMMARY OF THE INVENTION

A system for providing low insertion force electrical interconnections between high density contacts for use in interconnecting circuit packages. A housing has disposed therein one or more pre-buckled beam connectors. Each connector has a resilient insulative strip carrying a plurality of buckling beams electrically isolated from each other. The beams are aligned on the plane defining the strip in parallel with ends extending away from the strip edges in opposing directions. Means are provided for deforming the strip within the housing prior to effecting desired interconnections whereby the beams are pre-buckled. Upon urging contacts into proximity with the beam ends, the buckling force is released causing each beam's ends to be urged away from the strip into engagement with respective contacts, thereby effecting desired interconnection between contacts and through one or more beams.

Accordingly, in a preferred embodiment an electrical connector system is provided for interconnecting a circuit package to a card comprising a buckling beam contact means for electrically connecting each of a plurality of first contacts on said package to a corresponding one of a plurality of second contacts on said card; and a housing means retaining said buckling beam means for alternately establishing pre-buckling of said buckling beam means and release of said pre-buckling of said buckling beam means.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

FIG. 1 is a pictorial illustration of the connector system of the present invention in assembly with a circuit package and board;

FIG. 3 is a front pictorial view of the second housing half portion of the connector system of FIG. 1 when viewed from lines 3—3;

FIGS. 4a–e are simplified end elevational views of the connector system of the present invention depicted in FIG. 1 taken along line 4—4 illustrating the sequence of steps for effecting electrical interconnections between the circuit package and board of FIG. 1 in the manner of the invention;

FIG. 5 is an enlarged pictorial view of one of the buckling beam strips and the elastomeric connector strip of FIG. 1;

FIG. 6 is a simplified elevational end view in section of an alternate embodiment of the housing of FIG. 1 prior to assembly;

FIG. 7 is another simplified end view in section of the alternate embodiment of the housing depicted in FIG. 6 in assembly;

DETAILED DESCRIPTION OF THE PREFERRED EMBODIMENT

Figure 2:
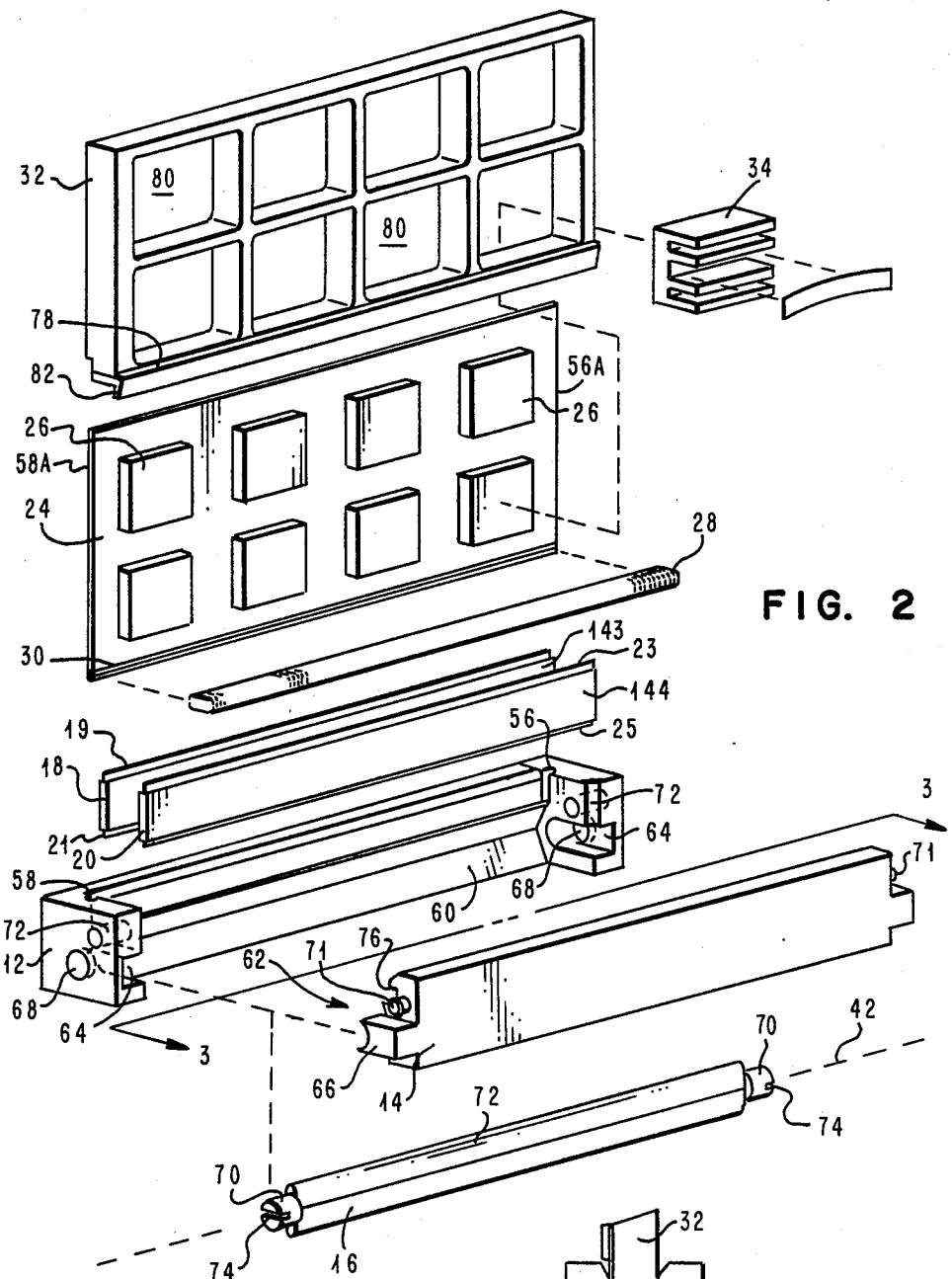
FIG. 2 is an exploded pictorial view of the illustration of the connector system of FIG. 1.

Referring first to FIG. 1, a connector system 10 of the present invention is shown in assembly with a circuit package 22 and board 36. The circuit package includes an elastomeric connector strip 28 (shown in greater detail in FIG. 5) having a plurality of first contacts 122, FIG. 5, and a board 36 having disposed thereon a second plurality of contacts 130. It will be recalled that the purpose of the connector system 10 is to effect a reliable interconnection between preselected ones of the first contacts with corresponding preselected ones of the second contacts. The manner in which this is accomplished will be discussed only in a general way with reference to only those components necessary to gain a general understanding of the operation of the invention with particular reference to the sequence of operation depicted in FIGS. 4a–e before thereafter describing the various components in greater detail. The purpose in effecting such interconnections by the invention is to interconnect circuits in a desired fashion at one location such as on the carrier 24 with those disposed at another location such as on the board 36. However, although in the embodiments depicted herein these circuits which are desired to be interconnected are shown as being disposed on carrier 24 and boards 36, it will be readily appreciated that the invention is far broader in scope and not intended to be limited to any particular locations wherein circuits reside which are to be connected.

Still referring to FIG. 2, the connector system 10 includes a housing comprised of first and second halves 12, 14, respectively, a buckling controller 16, and a buckling beam contact means which in the embodiment shown is comprised of one or more buckling beam strips such as the first and second strips 18, 20, respectively. These strips may preferably be in the form shown in co-pending U.S. Pat. No. 07/347,695, filed May 5, 1989, entitled "High Density Interconnect Strip" which is incorporated herein by reference.

With more particular reference to the components of the circuit package 22, residing on the carrier 24 are a plurality of circuit modules 26. The carrier 24 is circuitized as desired including interconnections to the circuit modules 26 or other components as desired and has lead outs to the carrier edge 30. Further comprising the circuit package 22 is a carrier housing 32 defining a plurality of apertures 80 into which the modules 26 extend. Heat sinks 34 may be provided which may be affixed to the modules 26 as desired.

Figure 4E:
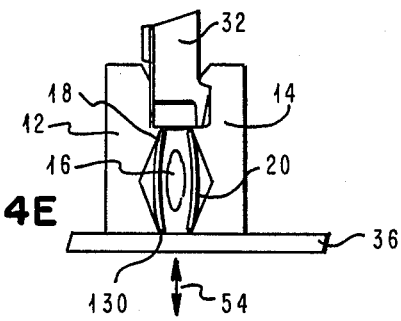

As shown in FIG. 4c, with the circuit package 22 in assembly the elastomeric strip 28 is retained at the lower edge of housing 32 in a pocket defined by housing lip 82 and carrier edge 30 of the carrier 24. With the first and second housing halves disposed together on the board 36 with the buckling controller 16 and buckling strips 18, 20 disposed therein in the manner shown in FIG. 1 and FIGS. 4a–4e, the operation of the connector system 10 may now be generally understood with reference to these FIGS. 4a–4e which depict the sequence of operation in effecting the desired interconnections.

The general sequence is that first the buckling strips 18, 20 are pre-buckled, i.e., spread laterally outwards from the orientation shown in FIG. 4a to that of FIG. 4b by proper rotation of the buckling controller 16 in preparation for receipt of the circuit package 22. With the buckling beams thus readied and in a pre-buckled state, as shown in FIG. 4c the pre-assembled circuit package 22 is urged downwards into the position shown in FIG. 4d whereby the lower portion of the circuit package 22 including the elastomeric strip 28 is retainedly disposed in the carrier housing cavity 44 (FIG. 4a).

Comparison of FIGS. 4d and 4e indicates that upon subsequent rotation of the buckling controller 16 an additional 90°, the buckling strips 18, 20 are thereby returned to their more elongate configurations shown in FIG. 4e thereby resembling their initial unbuckled states of FIG. 4a by re-extending themselves in the direction shown by arrows 54. The effect of such reconfiguring of the strips 18, 20 is to effect the desired electrical interconnections between each preselected one of the plurality of first contacts on the circuit package 22 with a corresponding pre-selected one of the plurality of second contacts 130 disposed on the board 36. More particularly, as may be more clearly seen with reference to FIG. 5, by the aforementioned release of the pre-buckled wires or beams 120, for example, of strip 18, they may be brought into mating electrical engagement with pads 122 of elastomeric strip 28. Prebuckled wires 123 may, in like manner, be brought into like engagement with pads 130 carried on board 36 to thereby complete the desired interconnections. Moreover, remaining ones of such wires as, for example, wires 121 may remain in electrical isolation with respect to strip 28 and board 36 by reason of separation of pads 122 in the elastomeric strip 28 by non-conductive pads 124 and the omission of contacts in vertical registry with these wires 121 on the surface of board 36.

Now that a general understanding of the construction of the connector system 10 and its operation has been provided a more detailed discussion hereinafter follows of more particular features of the invention. Referring back to FIG. 2, the buckling beam strips 18 and 20, as previously indicated with reference to FIG. 5, include pluralities of first contacts comprised of wire-like extensions 19, 21, 23, and 25. Each of these extensions is actually only an exposed portion of a thin wire-like buckling beam member extending through a beam carrier 142, 144. More detailed explanation of these buckling beam strips 18, 20 may be obtained by reference to the previously mentioned co-pending U.S. Pat. No. 07,347,695.

Still referring to FIG. 2 in the embodiment depicted therein the housing may be seen to actually be comprised of first and second housing halves 12 and 14 having inner faces 60 and 62 (FIG. 3), respectively. With the housing halves 12, 14 assembled in the manner shown in FIG. 1 and FIGS. 4a–4e, these inner faces 60, 62 define a cavity bifurcated by the first and second strips 18, 20 into first and second cavity portions 38 and 40 into which the strips 18, 20 are urged upon rotation of the controller 16. The housing halves 12, 14 may be releasably held together with a number of appropriate means such as the clips 146 shown in FIG. 1. Slots 64 extend through the opposing ends of first housing half 12 so as to slidably and matingly receive guide members 66 on opposing ends of the second housing half 14. Apertures 68 are further disposed in the opposing ends of first housing half 12 in the longitudinal direction thereof so as to communicate with the slots 64. These apertures 68 are intended to matingly and rotatably receive cylindrical nubs 70 disposed on extending ends of the buckling controller 16 and may include slots 74. By means of these slots 74, when the buckling controller is thereby installed in assembly and retainably held within the housing halves 12, 14 (by reason of insertion of these nubs 70 into their respective mating apertures 68) the buckling controller 16 may fully rotated about its longitudinal axis 42 very readily. More particularly by accessing these slots 74 through their respective apertures 68 by an appropriate tool such as a screwdriver or the like the controller 16 may be rotated.

From the preceding discussion of the general operation of the connector system 10 it will be appreciated that the purpose for effecting such rotation of the buckling controller, is to pre-buckle and effect release of such pre-buckling forces in the buckling strips in the manner illustrated in the drawing sequence of FIGS. 4a–4e. The ends of the guides 66 on the opposing ends of the second housing half 14 may be seen to be semicircularly shaped so as the to readily conform about the screw heads 70 of the buckling controller 16 when the controller 16 and first and second halves are in assembly. Apertures 72 may also be provided in the opposing ends of the first housing half 12 to receive nubs 71 extending axially outwards from opposing ends of the second housing half 14. These nubs will receive retention screws through apertures 72 to hold the housing halves and controller 16 in assembly.

Still referring to FIG. 2, the upper portion of the housing lip 82 may preferably include a retention surface 78 intended to matingly engage a like second housing half retention surface 76 and housing half 14. As may be seen from FIG. 4d, upon insertion of the lower end of the circuit package 22 into the carrier housing cavity 44, these surfaces 76–78 thereby engage one another so as to retain the circuit package 22 within the cavity 44. This is so notwithstanding the upward force acting upon the package 22 by release of the pre-buckling forces when the buckling controller 16 is reoriented about its longitudinal controller axis 42 from the position shown in FIG. 4d to that of FIG. 4e. Slots 56, 58, FIG. 2, may be provided extending vertically downwards into the first housing half 12 from the upper surface thereof, the purpose of which is to matingly and slidably receive corresponding edges 58a, 56a, respectively, of the carrier 24 when the lower end of the circuit package 22 is disposed within the carrier housing cavity 44, as shown in FIG. 4d.

The buckling controller 16 may be seen to include an elongate paddle-like or vane shaped extension 72 extending along the longitudinal axis 42 of the controller in opposing directions normal thereto. The purpose of this extension 72 it will be recalled is twofold. First, with the plane defined by the extension 72 extending in a generally upwards direction parallel to the planes defined by the vertically extending buckling strips 18, 20, as shown in FIG. 4a, the strips 18, 20, are in an unbuckled state. However, upon rotation of the controller 16 about the axis 42 in either direction 90° so as to bring the extension 72 into the position shown in FIG. 4b, opposing outward forces are thereby exerted by the extension 72 on the strips 18, 20 so as to urge them into their respective first and second cavity portions 38, 40 as shown in FIG. 4b, thereby effecting the first purpose of the controller 16, namely to place the buckling beam means in a pre-buckled state.

The second purpose of the controller 16 and extension 72 may be further recalled with reference to FIGS. 4d and 4e whereby upon subsequent rotation again of the extension 72 in yet an additional 90° relative to the position shown in FIG. 4d after insertion of the lower portion of the circuit package 22 into the housing cavity 44, this pre-buckling state of the buckling beam means is thereby released. This in turn causes the upper wire extension 19, 23 of corresponding strips 18 and 20 to contact the elastomeric strip 28 at locations 46, 48, respectively as shown in FIG. 4d. Similarly, this release of the pre-buckling forces also causes more secure engagement of the lower wire extension 21, 25, FIG. 2, with desired ones of the plurality of second contacts carried on the board 36 such as those depicted at reference numerals 130, FIG. 5 as shown at locations 50, 55, FIG. 4a.

With reference now to FIGS. 6 and FIG. 7, an alternate embodiment connector system 88 is depicted therein employing only one buckling beam strip. More particularly, in FIG. 6, this alternate connector system 88 is shown in a pre-assembled state whereas in FIG. 7 it is shown in an assembled state in preparation for effecting the desired interconnection between the plurality of first and second contacts. Referring first to FIG. 6 in more detail, first and second housing halves 90, and 92 are shown which are correlative to first and second housing halves 12, 14 of the embodiment of FIG. 1. Moreover, in like manner, the first housing member 90 is seen to include an inner surface 96 defining a cavity 98. This surface may be conductive and in electrical contact with one or more of the wires or beams of the buckling beam strip it contains.

The second housing half 92 includes an extension 104 extending longitudinally the length of the housing halves 90, 92, as does the cavity 98. A single elastomeric strip 94 is provided in this embodiment having the axially outwardly extending wire contact portions 110, 112 in opposing relationship.

In assembly, as shown by comparison of FIG. 6 and 7, by urging the first and second housing halves 90, 92 towards one another in the direction shown by arrows 100, 102, the housing is thereby accordingly urged into assembly the intermediate stage of which is shown in FIG. 7. As was the case with respect to the embodiment shown in FIG. 1 when the extension vane 72 was oriented in the configuration of FIG. 4c, by such assembly of the housing halves in the manner shown in FIG. 7 the buckling beam strip 94 is accordingly deformed or pre-buckled by means of the extension 104 acting against the central portion of the buckling beam strip 94 thereby urging it inwardly into the cavity 98. Pluralities of first and second contacts functionally analogous to those on elastomeric strip 28 and board 36 are shown schematically at reference numerals 106, 108, respectively. Upon release of this pre-buckling force in a manner to be hereinafter described with reference to FIG. 8, it will be appreciated that the similar operation of electrical interconnections as desired between first and second contact points 106, 108 is thereby effected through the buckling beam strip 94.

Figure 8:
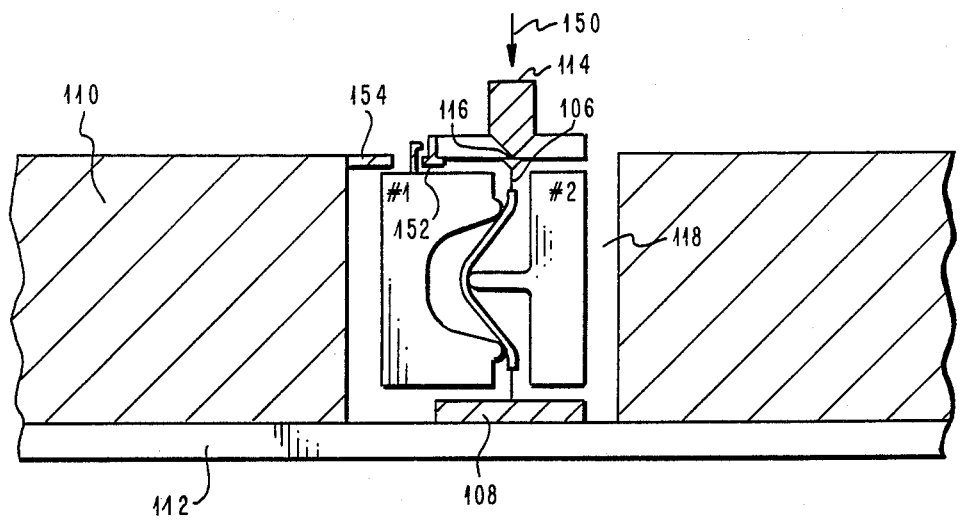
FIG. 8 is a simplified elevational end view in section of the alternate embodiment of the connector system of FIG. 6 when installed on a card and prior to effecting electrical interconnection between the card and the circuit package.

Thus, with reference now to FIG. 8, there will be seen depicted therein schematically a board 112 carrying a board housing 110 which has a cavity 118 disposed therein for retainedly receiving the housing assembly shown in FIGS. 6–7. The card 112 will be seen to have disposed thereon a plurality of second contacts 108. In like manner, a circuit package 114 may be seen to include a plurality of first contacts 106. The circuit package 114 further may preferably include a wedge pry mechanism 116. Upon urging the circuit package 114 in a generally downwards direction as shown by arrow 150 whereby the wedge pry mechanism 116 is thereby caused to engage the upper surface of the housing assembly, the first and second housing assembly halves 90, 92 are thereby moved laterally in opposing directions from those shown by the arrows 100, 102 in FIG. 6. In this manner (similarly to the effect of rotating the extension vane 72 from the orientation of FIG. 4d to that of FIG. 4e, the pre-buckling shown in FIG. 7 of the buckling strip is thereby released so as to effect the various electrical interconnections between the first and second contacts 106, 108 as desired. By provision of members 152 on the circuit package 114 and 154 on the housing 110, by interaction therebetween as shown in FIG. 8 during the urging of the circuit package 114 toward the card 112, the package 114 is thereby latched to the board housing 110.

While the invention has been shown and described with reference to particular embodiments thereof, it will be understood by those skilled in the art that the foregoing and other changes in form and details may be made therein without departing from the spirit and scope of the invention.

We claim:

1. An electrical connector system for interconnecting a circuit package to a card comprising
   a buckling beam strip means carrying a plurality of buckling beams for electrically connecting each of a plurality of first contacts on said package to a corresponding one of a plurality of second contacts on said card; and
   a housing means retaining said buckling beam strip means for alternately establishing pre-buckling of said buckling beam strip means and release of said pre-buckling of said buckling beam strip means.

2. The apparatus of claim 1 wherein
   said buckling beam means is a single contact strip;
   said housing means defines a cavity and includes an extension receivable by said cavity; and
   said buckling beam strip means is disposed between said cavity and said extension whereby upon urging of said extension into said cavity said pre-buckling of said buckling beam strip means occurs.

3. The apparatus of claim 2 further including means for maintaining said buckling beam strip means in said pre-buckling state until said circuit package engages said housing means.

4. The apparatus of claim 3 further including means for effecting said releasing of said pre-buckling after said engaging of said housing means by said circuit package.

5. The apparatus of claim 4 wherein said releasing means includes means for said effecting of said releasing in functional response to said engaging of said housing means by said circuit package.

6. The apparatus of claim 2 wherein during said pre-buckling, said buckling beam strip means is urged into said cavity by contact with said extension.

7. The apparatus of claim 1 wherein said housing means includes a means for urging said buckling beam strip means into a cavity defined within and by said housing means by rotation of said urging means.

8. The apparatus of claim 7 wherein said urging means is within said cavity.

9. The apparatus of claim 8 wherein said buckling beam strip means comprises a pair of buckling beam strips.

10. The apparatus of claim 9 wherein said cavity is comprised of a left and a right portion; and wherein said urging means includes means for alternately urging each said buckling beam strip into and out of a corresponding one of said cavity portions and into and out of said buckling state.

11. The apparatus of claim 1 wherein said housing means includes a buckling controller means disposed within said housing means and on one side of said buckling beam strip means for urging said buckling beam strip means into said pre-buckling and said release.

12. The apparatus of claim 1 wherein said housing means includes a buckling controller and wherein said buckling beams extend around said controller.

13. The apparatus of claim 11 wherein said buckling beam strip means is interconnected to said buckling beams to dispose said beams in preselected relative spatial positionings.

14. The apparatus of claim 11 wherein said buckling beam strip defines a plane; and wherein said buckling beam controller means is positionable to exert a force on said buckling beam strip means normal to said plane.

15. A method for establishing a plurality of electrical interconnections, each being between one of a plurality of first contact points and one of a plurality of second contact points, comprising disposing a buckling beam contact means having a plurality of contact wires between said first and second pluralities of contact points;
pre-buckling said buckling beam contact means; and
releasing said buckling of said buckling beam contact means until each of said contact wires establishes one of said interconnections.

16. The method of claim 15 wherein said step of disposing said buckling beam contact means comprises positioning a housing defining a cavity therein between said pluralities of first and second contact points; and
disposing said buckling beam contact means within said housing with the axial direction of said contact wires oriented towards said pluralities of first and second contact points.

17. The method of claim 16 wherein said pre-buckling comprises urging said buckling beam contact means into said cavity.

18. The method of claim 17 wherein said urging is in a direction transverse to said axial direction.

19. The method of claim 17 wherein said buckling beam contact means comprises first and second buckling beam strips disposed in parallel within said housing; wherein said cavity defines first and second portions; and wherein said step of urging of said buckling beam contact means comprises urging said first and said second strips away from each other and into said first and second cavity portions, respectively.

20. The method of claim 18 further including urging said first plurality of contact points in said axial direction toward said housing; and wherein said releasing of said buckling is in response to said urging of said first plurality of contact points.

21. The method of claim 19 wherein said housing includes a buckling controller disposed between said first and said second strips; and wherein said pre-buckling includes the step of rotating said controller to a first position.

22. The method of claim 21 wherein said releasing step includes the step of rotating said controller to a second position.

23. The method of claim 16 wherein said first plurality of contact points are disposed in a circuit package; and wherein said method further includes releasably interconnecting said circuit package to said housing.

24. The method of claim 23 wherein said step of releasing said buckling is during said releasable interconnection of said circuit package to said housing.

* * * * *

UNITED STATES PATENT AND TRADEMARK OFFICE
CERTIFICATE OF CORRECTION

PATENT NO. : 4,943,242

DATED : July 24, 1990

INVENTOR(S) : Richard F. Frankeny, Javad Haj-ali-Ahmadi, Ronald L. Imken, Rolf Wustrau and Brian D. Arldt It is certified that error appears in the above-identified patent and that said Letters Patent is hereby corrected as shown below:

On the title page item [75], please add inventor --Brian D. Arldt of Austin, Texas--.

Signed and Sealed this

Eleventh Day of August, 1992

Attest:

DOUGLAS B. COMER

*Attesting Officer*         *Acting Commissioner of Patents and Trademarks*